(12) United States Patent
Park et al.

(10) Patent No.: US 6,999,345 B1
(45) Date of Patent: Feb. 14, 2006

(54) METHOD OF SENSE AND PROGRAM VERIFY WITHOUT A REFERENCE CELL FOR NON-VOLATILE SEMICONDUCTOR MEMORY

(75) Inventors: Ki-Tae Park, Beacon, NY (US); Tomoko Ogura, Hopewell Jct., NY (US)

(73) Assignee: Halo LSI, Inc., Hillsboro, OR (US)

(*) Notice: Subject to any disclaimer, the term of this patent is extended or adjusted under 35 U.S.C. 154(b) by 106 days.

(21) Appl. No.: 10/699,331

(22) Filed: Oct. 31, 2003

Related U.S. Application Data

(60) Provisional application No. 60/424,251, filed on Nov. 6, 2002.

(51) Int. Cl.
*G11C 11/34* (2006.01)

(52) U.S. Cl. .............................. 365/185.18; 365/185.22

(58) Field of Classification Search ........... 365/185.22, 365/185.18
See application file for complete search history.

(56) References Cited

U.S. PATENT DOCUMENTS

| | | | |
|---|---|---|---|
| 5,124,945 A | 6/1992 | Schreck ...................... | 365/185 |
| 5,444,656 A | 8/1995 | Bauer et al. ............ | 365/189.01 |
| 5,559,737 A * | 9/1996 | Tanaka et al. ......... | 365/185.25 |
| 5,712,815 A | 1/1998 | Bill et al. ............... | 365/185.03 |
| 6,003,051 A * | 12/1999 | Okazaki ........................ | 708/3 |
| 6,009,015 A | 12/1999 | Sugiyama .............. | 365/185.22 |
| 6,031,760 A | 2/2000 | Sakui et al. ........... | 365/185.21 |
| 6,044,019 A | 3/2000 | Cernea et al. ......... | 365/185.21 |
| 6,075,727 A | 6/2000 | Morton et al. ......... | 365/185.22 |
| 6,618,297 B1 | 9/2003 | Manea ................... | 365/189.09 |
| 6,768,354 B1 * | 7/2004 | Yamazaki et al. .......... | 327/143 |

* cited by examiner

*Primary Examiner*—M. Tran
(74) *Attorney, Agent, or Firm*—George O. Saile; Stephen B. Ackerman

(57) ABSTRACT

A method and circuit for verify and read of a nonvolatile memory cell without the use of a reference cell is described. The circuit comprises a sense amplifier that compares a voltage from the output of a read path of a selected bit line to a reference voltage. When the selected memory cell is erased, the bit line voltage is small pulling down the read path voltage below the reference voltage, which causes a sense amplifier output that is a logical "0". When the selected cell has been programmed, the raise of the bit line voltage causes the bit line to be decoupled from the output of the read path. The read path output then continues to charge to a voltage higher than the reference voltage resulting in a logical "1" at the output of the sense amplifier.

32 Claims, 6 Drawing Sheets

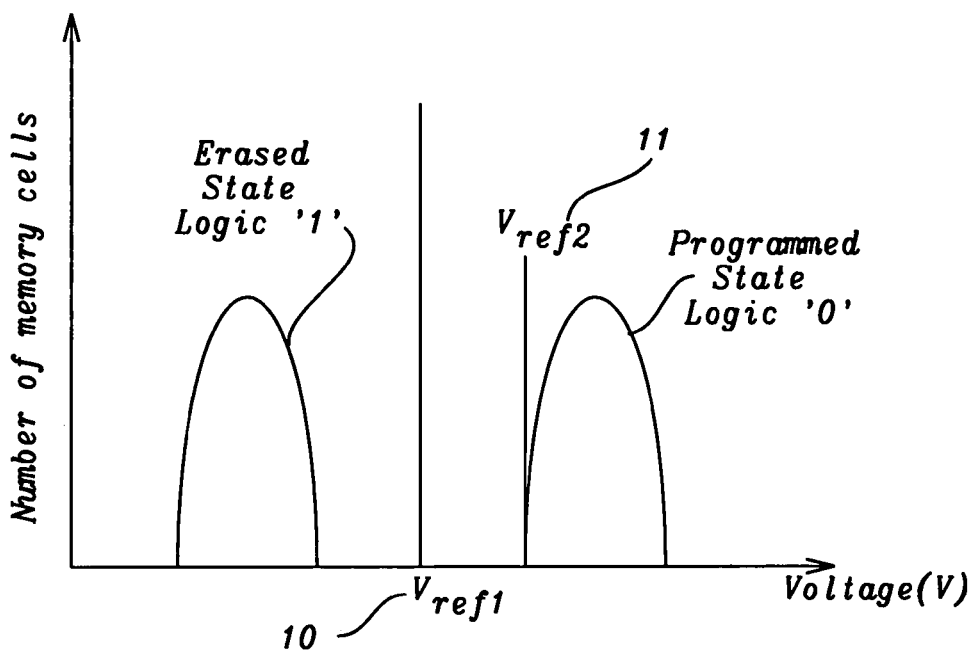
FIG. 1 – Prior Art
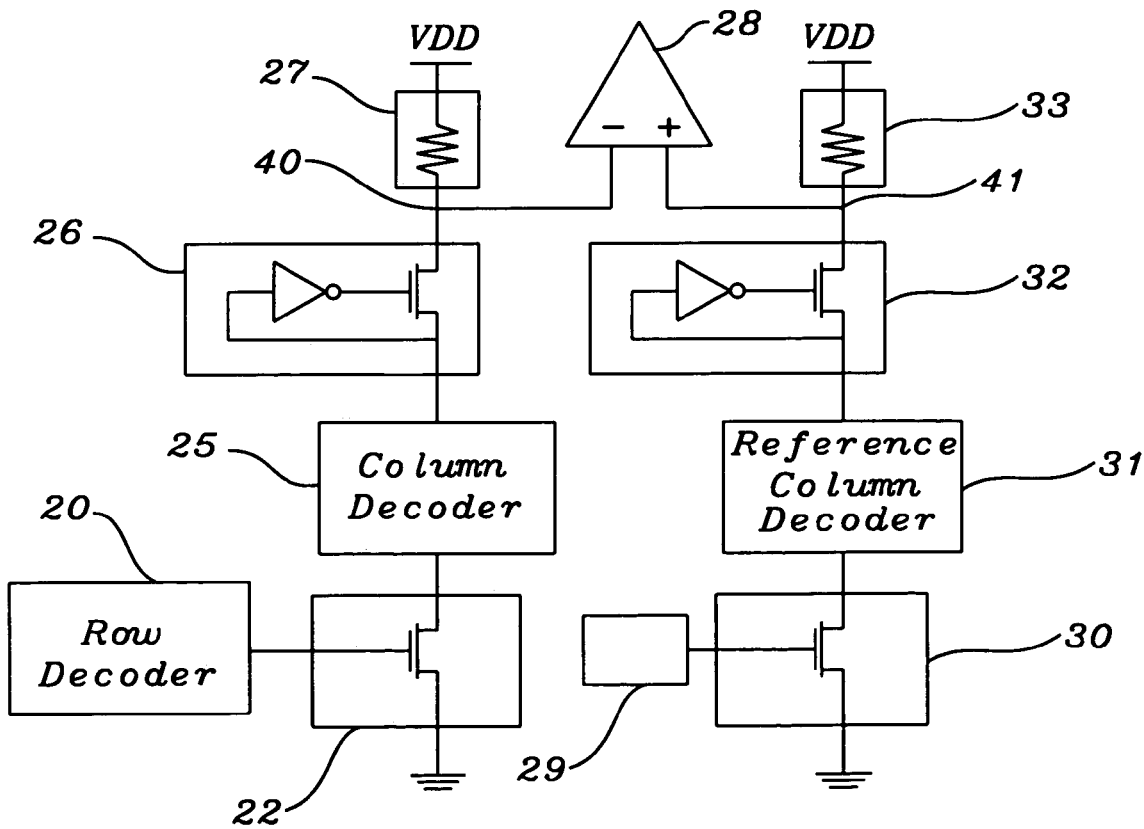
FIG. 2 – Prior Art

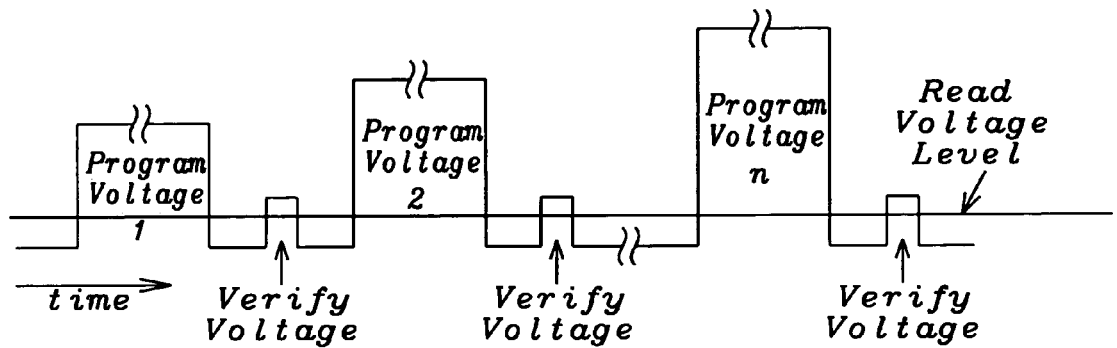
FIG. 3 – Prior Art
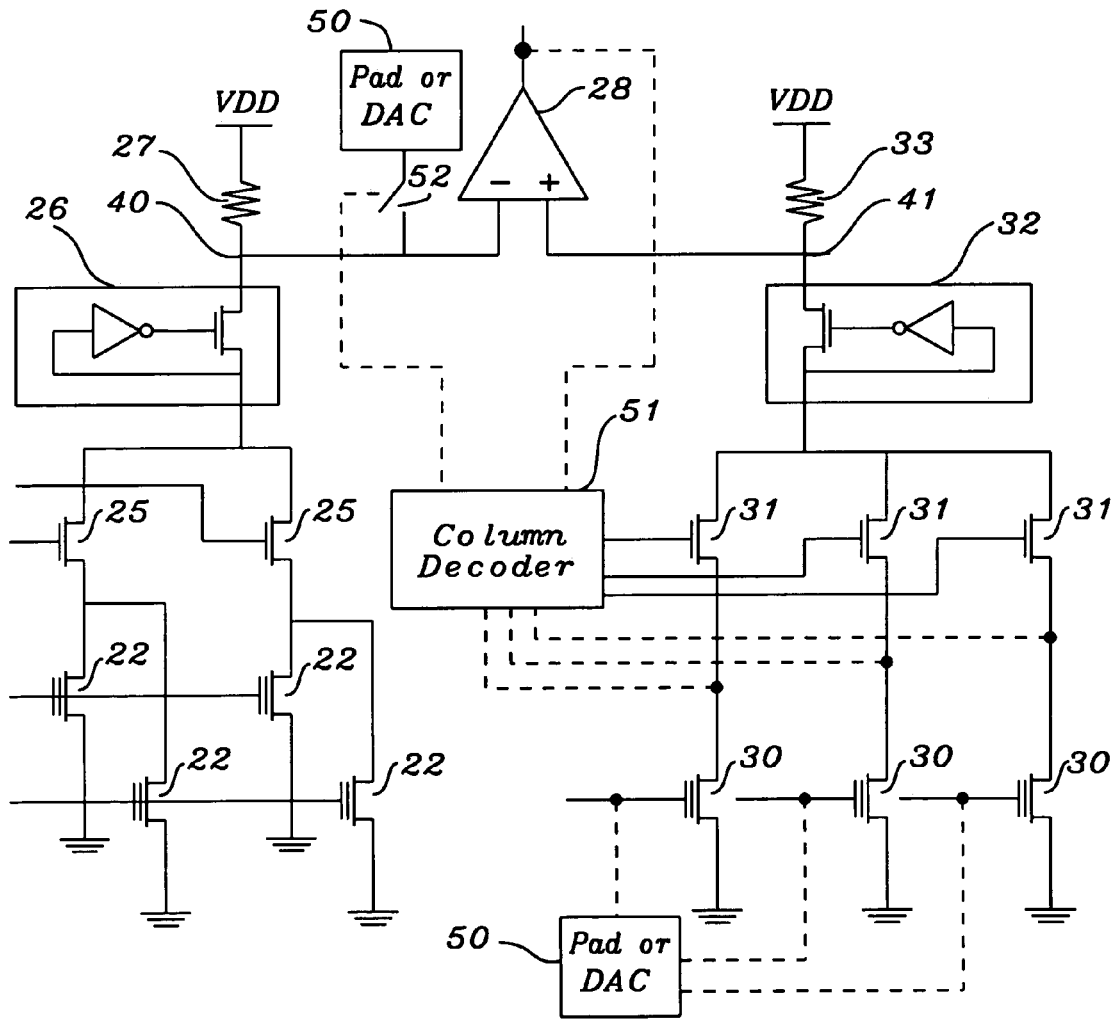
FIG. 4 – Prior Art

METHOD OF SENSE AND PROGRAM VERIFY WITHOUT A REFERENCE CELL FOR NON-VOLATILE SEMICONDUCTOR MEMORY

This application claims priority to Provisional Patent Application Ser. No. 60/424,251, filed on Nov. 6, 2002, which is herein incorporated by reference.

BACKGROUND OF THE INVENTION

1. Field of Invention

The present invention relates to semiconductor memory and in particular to verification of sense and program operations for non-volatile memory.

2. Description of Related Art

The requirements for increase performance in low power systems has caused an increased demand for high speed and low power non-volatile semiconductor memory devices, such as read only memory (ROM), programmable read only memory (PROM), erasable programmable read only memory (EPROM), electrically erasable read only memory (EEPROM), and flash EEPROM. To achieve a high performance non-volatile memory the memory cell needs to have high current capability as well as a low power and high performance read path. The non-volatile memory can be either a NOR type or a NAND type arrangement depending upon the connectivity between the cells and the bit lines. Because the cell current is higher in the NOR connected cell, the NOR connected cell is more suited for high performance than the NAND connected cell.

In U.S. Pat. No. 6,618,297 B1 (Manea) the establishment of boundary current levels is directed to providing more than two memory states for a non-volatile memory. The reference currents are defined by multiple pre-programmed reference memory cells. U.S. Pat. No. 6,044,019 (Cemea et al.) is directed to canceling inherent noise fluctuations by averaging the sensing of current from a reference cell over a predetermined period of time, thus increasing the accuracy of sensing. The increased sensing accuracy allows a higher resolution of the conduction states of a non-volatile memory cell and alloys the cell to store more than one bit of data. U.S. Pat. No. 5,712,815 (Bill et al.) is directed to an improved programming structure in a non-volatile memory array containing multiple bits per cell. The memory array contains a plurality of memory cells and a reference cell array, which contains a plurality of reference cells by which programming and verifying the multiple bits is achieved. In U.S. Pat. No. 5,124,945 (Schreck) an apparatus is directed to verifying the state of a plurality of electrically programmable memory cells.

Data is stored in a non-volatile memory by changing the threshold voltage of the individual cells. The memory cells have at least two states, programmed and erased. More states are available by creating additional programmed states in which there are additional threshold voltage levels used. In FIG. 1 is shown the distribution of threshold voltages for an erased state representing a logical "1" and for a programmed state representing a logical "0". The erased state typically represents a logical "1" and the programmed state typically represents a logical "0". From FIG. 1 it is seen that both the erased and programmed states are formed from a range of voltages. The separation between the programmed and erased states should be large enough to allow a sensing circuit to distinguish between the states.

Continuing to refer to FIG. 1, in conventional nonvolatile memories, a reference cell used for reading has a threshold voltage $V_{ref1}$ 10 that is located between the erased state and the programmed state. The reference voltage applied to the reference cell is used to establish a current that is compared to the memory cell being read in order to determine whether the value of the stored data in the memory cell is a logical "1" or a logical "0". When the memory cell that is being read is in an erased state, the memory cell being read conducts more current than the reference cell because the memory cell being read has a lower threshold voltage. When the memory cell that is being read is in a programmed state, the memory cell being read conducts less current than the reference cell because the memory cell being read has a higher threshold voltage.

Referring to FIG. 2, an example of a conventional read circuit is shown. The memory cell 22 is located within a block of memory cells that is coupled to the read path circuitry, which includes the column decoder 25, the bit line bias circuit 26 and column load 27. The output of the read column 40 is coupled to the negative input of the sense amplifier 28. The reference cell 30, which connects 41 to the positive input to the sense amplifier 28, can be located within the memory or separately from the memory. The reference cell 30 is coupled to its own read path through a reference column decoder 31, a reference bias circuit 32 and a reference column load 33. When a memory cell is selected, the cell current creates a voltage drop at node 40 connected to the negative input to the sense amplifier. The voltage drop is a function of the selected memory cell current in which the higher the selected memory cell threshold voltage the lower the memory cell current. The sense amplifier then compares the voltage drop at node 41 caused by the current of the reference cell to the voltage drop at node 40 caused by the current of the memory cell being read.

A series of interleaved write and verify operations are performed in a conventional programming operation, an example of which is shown in FIG. 3. The gate voltage for each successive write pulse increases whereas the gate voltage during the verify operation remains constant throughout the programming operation. A regulated voltage greater than 10V is applied to the gate and a regulated voltage of 5V is coupled to the drain of the NOR memory cell being programmed to establish a channel-hot-electron (CHE) mechanism in the memory cell and to write a logical "0" into an erased cell having a threshold voltage representing a logical "1". After a predetermined amount of time the write operation is stopped and a verify operation using the reference cell is performed to determine if the memory cell is under-programmed. The verify reference cell threshold of $V_{ref2}$ 11 (shown in FIG. 1) is set at the lower edge of the distribution of the program state. The applied gate voltage to the reference cell is set approximately to $V_{ref2}$ 11, or slightly above. If the memory cell is under-programmed, additional write and verify operations are performed until the threshold voltage of the memory cell reaches the programmed state.

In the non-volatile memories the use of multi-bits per cells is used to increase the number of programmed states. The reference cells used for read and program operations are precisely programmed during manufacture under a controlled environment. In U.S. Pat. No. 5,444,656 (Bauer et al.), a method to trim reference cells was introduced, especially for memories with multi bits per cell. FIG. 4 illustrates a schematic diagram of a conventional memory where additional reference cells are used to provide capability to read and program multi-bits per cell. A plurality of memory cells 22 are coupled to column decoders 25 and then to bit line bias circuits 26 and column load 27 similarly as shown in FIG. 2. A plurality of reference cells 30 are coupled to a plurality of reference column decoders 31 and then to a reference bias circuit 32 and the reference circuit load 33. The negative input to the sense amplifier is coupled to the column load 40, and the positive input of the sense amplifier is coupled to the reference circuit load 41. A controller 51 selects the reference decoder connected to the reference cell, which is to be programmed. The controller 51 also closes a switch 52, which allows an external voltage to be applied to the negative input of the sense amplifier, and at the same time a voltage is coupled to the gate of the reference cell that is to be programmed through an external pad or a DAC 53. The sense amplifier 28 compares the voltage applied through switch 52 to the threshold voltage of the reference cell 30 and adjusts the voltage applied to gates of the reference cells through the external pad or DAC 53. The method of establishing the reference cell threshold voltages is a slow process performed on every non-volatile memory chip. The circuitry involved in programming the reference cells, including the reference circuits, consume a large amount of power and silicon area.

SUMMARY OF THE INVENTION

It is an objective of the present invention to provide a sensing and program verification of a nonvolatile memory cell without the use of a reference cell.

It is also an objective of the present invention to provide a gate voltage of the selected nonvolatile memory cell that is the same voltage level as used in a read operation.

It is further an objective of the present invention to produce an interleaved sequence of program and verify voltages to the gate of the memory cell being programmed wherein each successive program voltage is large that the previous program voltage and each verify voltage is the same and equal to the gate voltage used in a read operation.

It is yet another an objective of the present invention is to determine the program state of a nonvolatile memory cell by sensing the bit line voltage of the memory cell being programmed after a predetermined period of time.

The essence of the present invention is that a reference voltage that is created without the use of a reference cell is compared to a voltage on the output node of a bit line read path. The reference voltage is either created by a reference line charged with a reference voltage or by use of a voltage generator whose output is common across all bit lines and reference lines on the memory chip. In either case the reference voltage is coupled to the positive input to a sense amplifier, and the sense amplifier compares this reference voltage to a voltage on an output node of the read path of the selected bit line. After a predetermined amount of time the voltage on the output node is either that of an erased cell, which is lower than the reference voltage, or that of an external bias of the chip containing the nonvolatile memory, which is higher than the reference voltage.

A program operation is alternated with a verify operation until the verify operation confirms that a nonvolatile memory cell has been programmed at which point the memory cell has a threshold voltage that is above a predetermined value. The verify operation is accomplished without a reference cell that is used in the prior art, and saves both memory chip real estate and memory chip power.

In the first embodiment a bit line connected to a memory cell being programmed and a reference line are charged to a predetermined voltage. An equalizer circuit is used to make the voltages on the reference line and the bit line the same value. The output node of the bit line read path, which is connected to the negative input to the sense amplifier, is charge to a voltage that is either the low voltage of an erased cell or a high voltage, such as $V_{DD}$.

When a selected word line is activated, the selected memory cell begins to conduct current. If the selected memory cell is erased (not programmed), the amount of current that is conducted will be higher than if the cell has been programmed, and the bit line voltage will decrease relatively fast. After a predetermined amount of time, if the memory cell has not been programmed, the bit line voltage will drop below a predetermined value that causes the bit line to be connected to the output node of the bit line read path. This in turn will discharge the sense node from a high voltage, such as $V_{DD}$, to a voltage lower than the voltage of the reference line, thus producing a logical "0" at the output of the sense amplifier and indicating that the memory cell has not been programmed. If the memory cell has been programmed, the bit line voltage will not have dropped below a predetermined value and the bit line will remain disconnected from the output node. The output node will remain charged to a voltage higher than the reference line, such as $V_{DD}$, and the sense amplifier will indicate a logical "1" at its output.

In a second embodiment the reference bit line is replaced by a clamping circuit, which is controlled by a reference voltage generator. The clamping circuit provides a reference voltage to the sense amplifier. While in standby mode all bit lines in a nonvolatile memory chip are discharged to ground, 0V. A constant voltage generator causes a small current to flow through a resistive PMOS device on the selected bit line read path to begin the charging of the selected bit line. A reference voltage generator causes a reference voltage to be coupled to the positive input to the sense amplifier, and the reference voltage generator causes the current from the resistive device to be coupled to the memory cell bit line through a bit line decoupling device. When current starts to flow through the bit line and the selected cell, the voltage on the bit line begins to rise. If the memory cell is not programmed (erased) the bit line voltage is clamped to an erased cell voltage $V_{EC}$, which is lower in amplitude than the reference voltage connected to the positive input of the sense amplifier. This low bit line voltage is coupled to the negative input of the sense amplifier, which produces a logical "0" at the output of the sense amplifier. If the cell is programmed, the voltage on the bit line will raise until the bit line decoupling device is cut off, and the voltage connected to the negative input to the sense amplifier will then rise rapidly to the high charging voltage of the resistive device at the top of the read path. This high charging voltage is higher than the voltage coupled to the positive input of the sense amplifier and will cause the output of the sense amplifier to produce a logical "1" denoting that the memory cell has been programmed.

BRIEF DESCRIPTION OF THE DRAWINGS

This invention will be described with reference to the accompanying drawings, wherein:

FIG. 1 shows a diagram of prior art of the distribution of both programmed and erased voltages of a nonvolatile memory cell, FIG. 2 shows a circuit diagram of prior art of a read path and the reference path uses to verify the programming of a nonvolatile memory cell, FIG. 3 shows a signal diagram of prior art of a sequence of program voltages and verify voltages used to program and verify a nonvolatile memory cell, FIG. 4 shows a circuit diagram of prior art used to program and verify multiple bits per nonvolatile memory cell.

DETAILED DESCRIPTION OF THE PREFERRED EMBODIMENT

Figure 5:
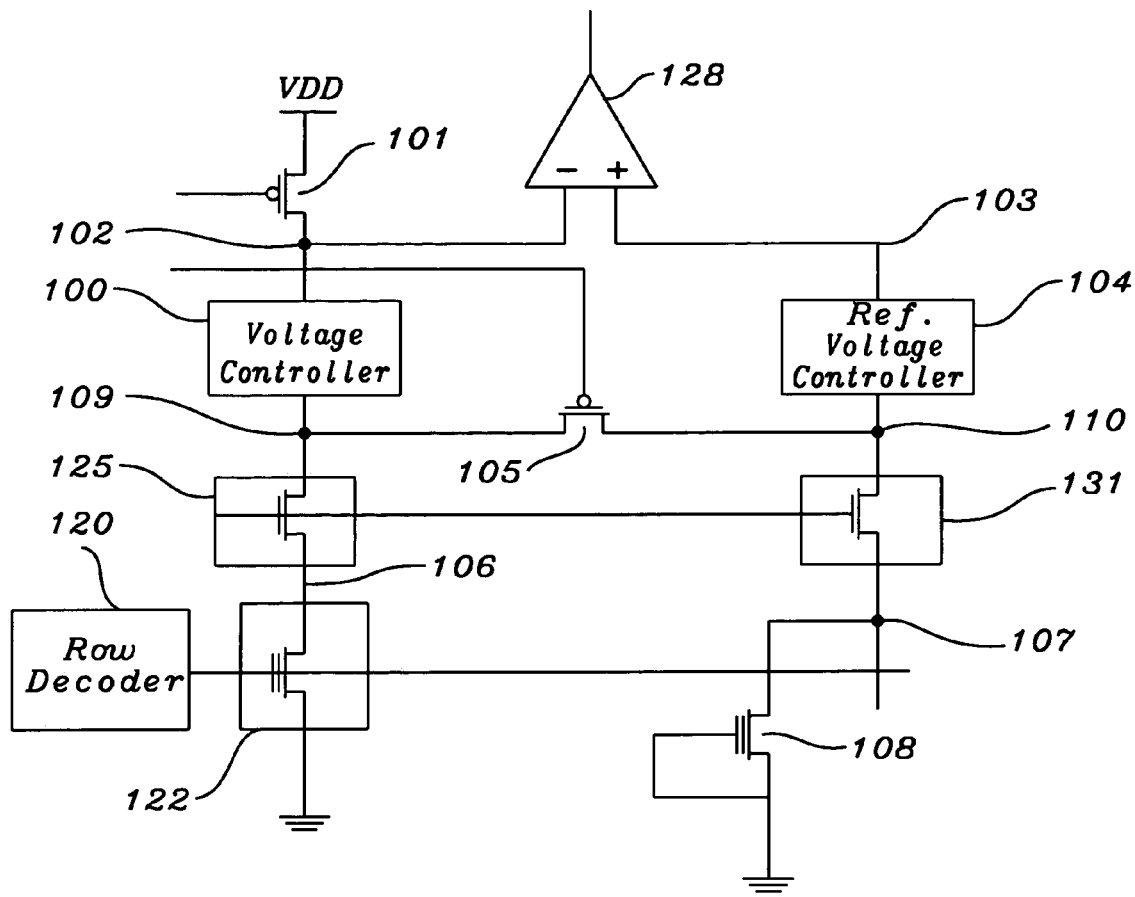
FIG. 5 shows a circuit diagram of the first embodiment of the present invention for the verifying of the programming of a nonvolatile memory cell.

In FIG. 5 a first embodiment of the present invention is shown for a sensing and program verifying circuit without the use of a reference generator. A nonvolatile memory cell 122 located within a memory block is coupled to a read path comprising a load device 101 connected to $V_{DD}$, a voltage control circuit 100 and a column decoder 125. A row decoder 120 is coupled to the gate of the nonvolatile memory cell 122. The output of the read path 102 is coupled to the negative input of the sense amplifier 128. A reference bit line 107 is coupled to a reference read path comprising a reference voltage control circuit 104, reference line decoder 131 and a dummy memory cell 108 to produce a reference line load similar to that of the memory bit line 106. The output of the reference read path 103 is coupled to the positive input of the sense amplifier 128. A voltage equalizing device 105 is connected between bit line read path 109 and the reference read path 110.

Continuing to refer to FIG. 5, during a read, or verify, operation the bit line 106 of the selected memory cell and the reference bit line 107 are precharged to a predetermined voltage $V_{PC}$ 201 (shown in FIG. 6) through voltage control circuits 100 and 104. The equalizer device 105 is turned on to allow the precharged voltages on the bit line 106 and the reference line 107 to become equal. The voltage control circuits 100 and 104 are turned off to decouple the read path output node 102 and the reference output node 103 from the bit line 106 and the reference line 107, respectively. The read path output node is then allowed to charge to $V_{DD}$ through the load device 101. Next the load device 101 is turned off so that the read path output node 102 is floating and charged to $V_{DD}$.

Figure 6:
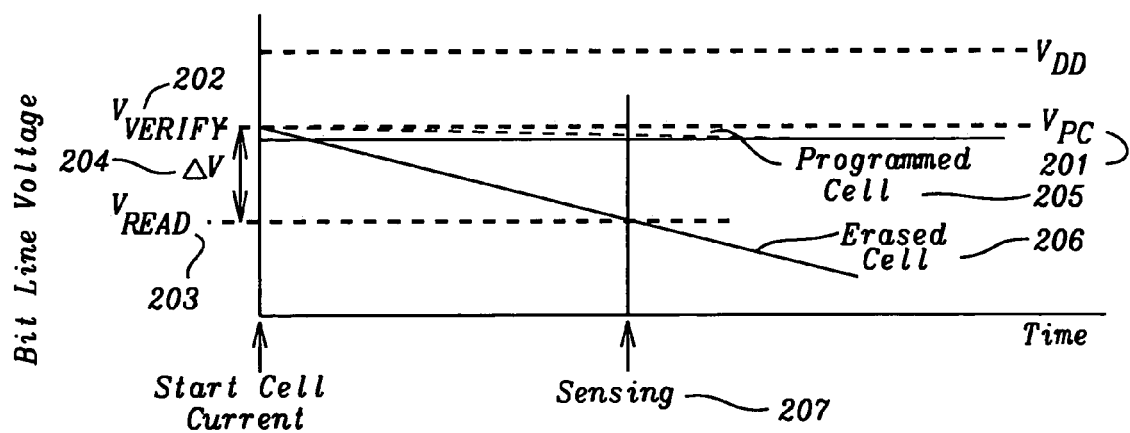
FIG. 6 shows a diagram of voltages of the present invention developed from the use of the circuit in FIG. 5.

Referring to FIG. 6 along with FIG. 5, when a word line selected the row decoder 120 is turned on to select a memory cell 122, a cell current begins to flow and the bit line 106 begins to discharge. If the selected memory cell 122 is erased, the bit line voltage decreases 206 faster than if the memory cell is programmed 205. After a predetermined amount of time 207, if the bit line voltage reaches a predetermined voltage level 203, the bias voltage control circuit 100 is turned on coupling the read path output node 102 to the bit line 106, which quickly discharges the precharged voltage $V_{DD}$ on node 102. The reference path output node 103 remains charged to the voltage $V_{PC}$ 201, and when the sense amplifier 128 turns on, a logical "0" is produced at the sense amplifier output. If the bit line voltage does not reach the predetermined voltage level 203, the bit line 106 remains isolated from the bit line path output node 102. The output node 102 remains charged to $V_{DD}$, and the output of the sense amplifier 128 produces a logical "1" since the precharge voltage $V_{DD}$ on the bit line output node 102 is higher than $V_{PC}$ to which the reference path output node has been charged.

Figure 7:
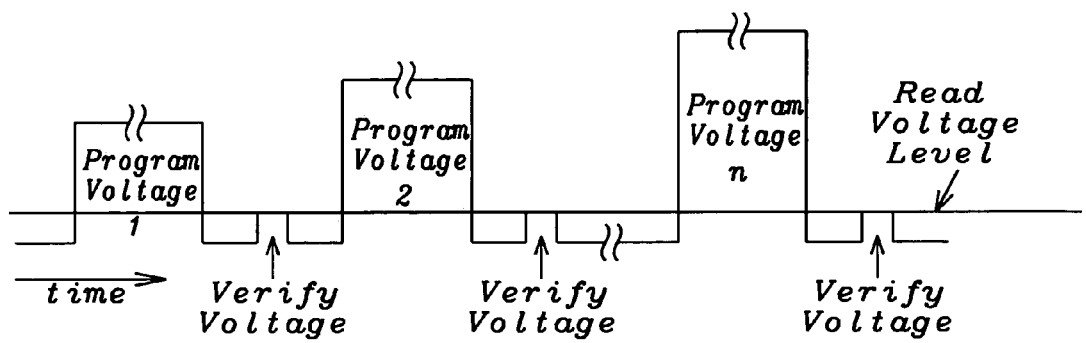
FIG. 7 shows a signal diagram of the present invention of the sequence of program and verify voltages used to program and verify a nonvolatile memory cell.

Programming the nonvolatile memory cell of the present invention requires a sequence of interleaved write and verify operations. In FIG. 7 is shown an example of the interleaved sequence of write and verify voltages applied to the gate of the memory cell being programmed. Each successive write voltage is higher in amplitude that the previous one starting with the first write voltage, Program Voltage 1 and continuing through Program Voltage n. The verify voltages applied to the gate of the memory cell are all the same amplitude as the read voltage. This allows the same circuit that generates the read voltage to also generate the verify voltage. The verify operation is performed similar to a read operation with the exception for the voltage of the voltage control circuit 100. As shown in FIG. 6, a verify bias voltage 202, which is higher than the read bias 203, is used to determine if the selected memory cell is under-programmed. If the bit line voltage reaches the verify level 202 during a program time duration, the cell being programmed is under-programmed. The cell is programmed again until the bit line voltage doe not reach the verify level 202. The difference 204 between the read voltage $V_{READ}$ 203 and $V_{VERIFY}$ 202 determines the voltage margin between sensing erased 206 and programmed 205 cells.

Figure 8:
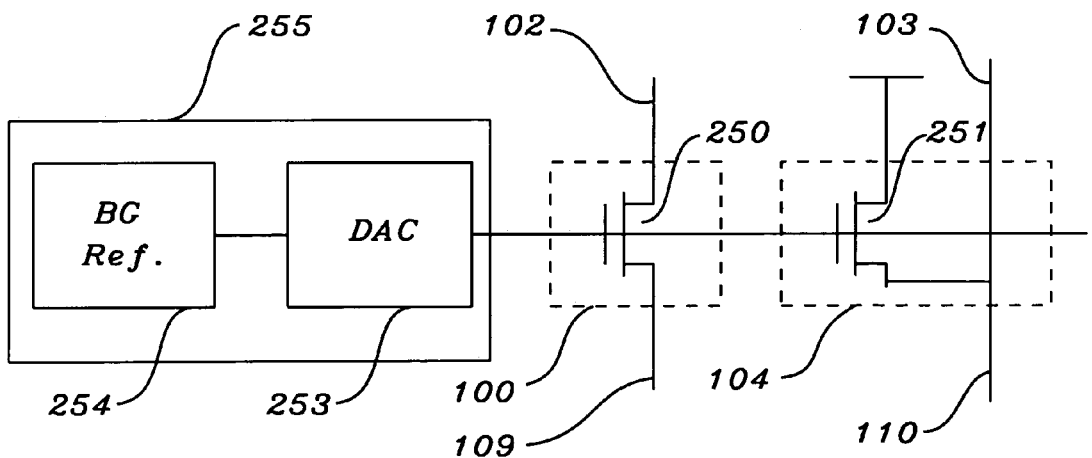
FIG. 8 shows a circuit diagram of the present invention of the bias voltage control circuit.

A circuit diagram of the voltage control circuit is shown in FIG. 8. An NMOS transistor 250 is used for the bit line voltage control circuit 100 and an NMOS transistor 251 is used for the reference bias voltage control circuit 104. The gates of all of the voltage control circuits in the memory chip are coupled to the output of the reference voltage generation circuit 255. The reference voltage generation circuit includes a band gap reference voltage generation circuit (BG Ref.) 254 and a digital to analog converter (DAC) 253. The DAC 253 produces the read bias voltage 203 and the verify bias voltage 202 which are selectively applied to the gates of transistors 250 and 251. The two voltages 202 and 203 are generated from the output of the band gap reference generator 254 so that the voltage difference 204 between the read voltage $V_{READ}$ 203 and $V_{VERIFY}$ 202 can be insured independently of temperature and supply voltage. Even though a variation of the precharging voltage of a bit line may vary because of process fluctuations that result in threshold voltage variations, the sensing and verify margins are assured because the same transistor 250 is used for precharge, sense and verify operations.

Figure 9:
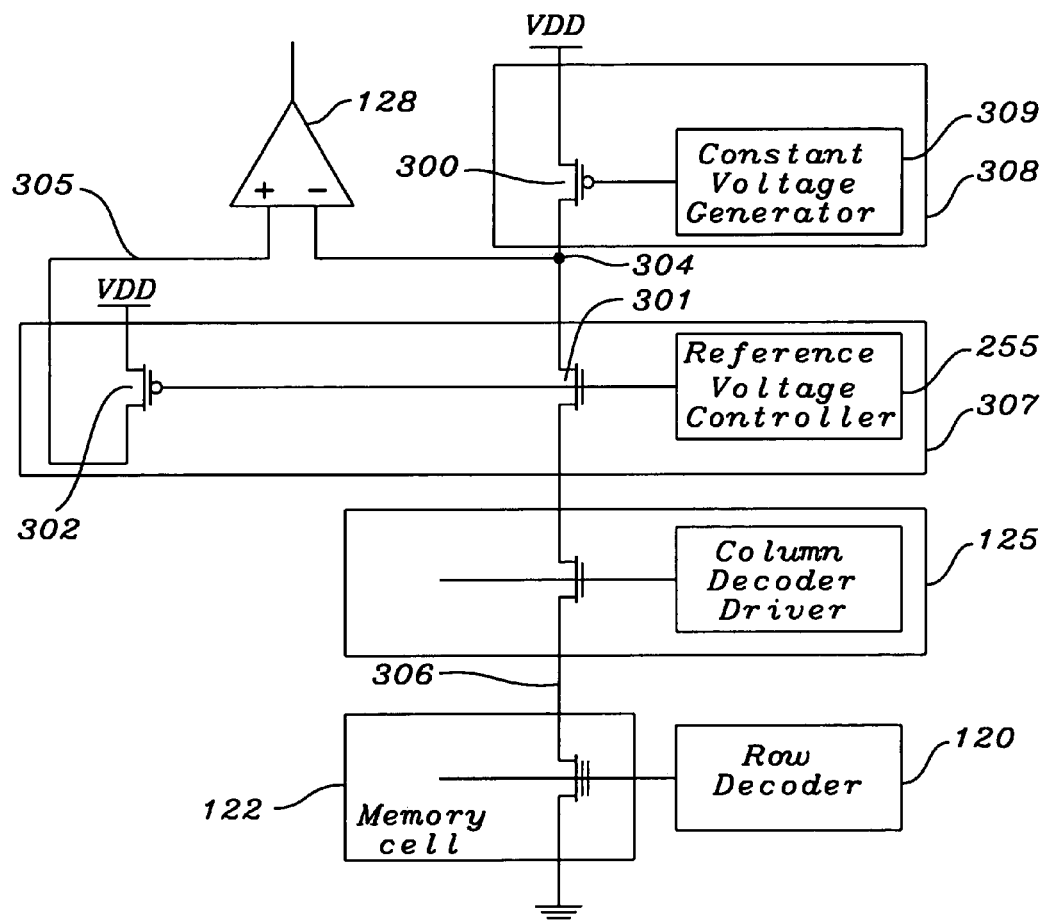
FIG. 9, shows a circuit diagram of second embodiment the present invention for the verifying of the programming of a nonvolatile memory cell.

In FIG. 9 is shown a schematic diagram of a second embodiment of the present invention. A nonvolatile memory cell 122 is located in a block of nonvolatile memory cells and is coupled 306 to the read path circuitry. The read path circuitry comprises a column decoder 125, a bias voltage control circuit 307 and a current load circuit 308. The bias voltage control circuit 307 comprises a bit line decoupling NMOS transistor 301, a voltage clamping NMOS transistor 302 and a reference voltage controller 255, which is shared by the entire memory chip. The voltage clamping transistor 302 is connected to $V_{DD}$ and the positive input 305 of the sense amplifier 128. The output of the reference voltage controller is coupled to the gates of the NMOS transistors 301 and 302. The current load circuit comprises a resistive PMOS transistor 300 connected between $V_{DD}$ and the output of the bit line read path 304, and a constant voltage generator 309, which drives the gate of the resistive PMOS transistor 300. The output of the bit line read path 304 is coupled to the negative input of the sense amplifier 128.

Figure 10:
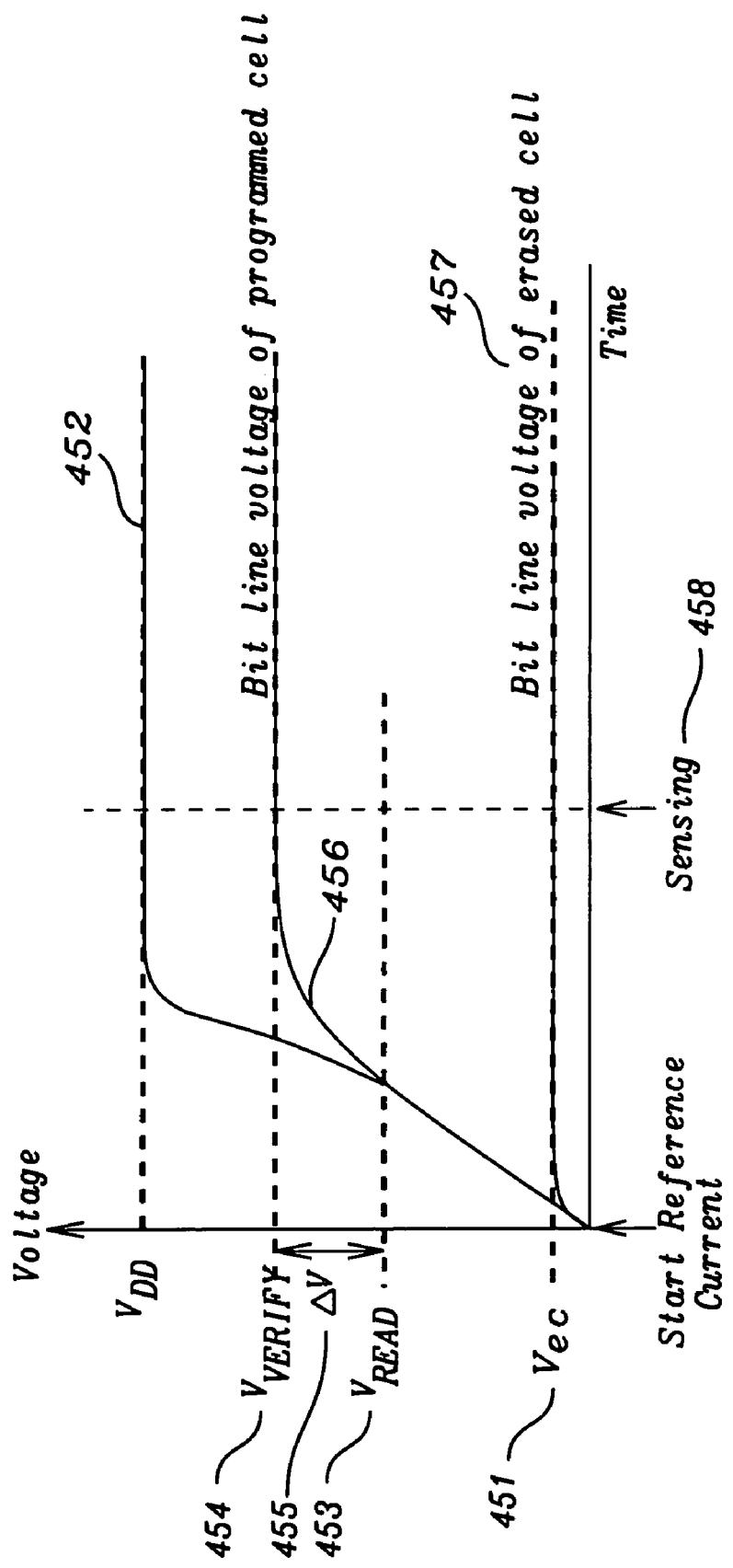
FIG. 10 shows a diagram of voltages of the present invention developed from the use of the circuit in FIG. 9.

Referring to FIGS. 9 and 10, during standby all bit lines are discharged to ground, 0V. When there is a read operation, the constant voltage generator circuit 309 generates a predetermined voltage, which is coupled to the gate of the PMOS transistor 300. The reference voltage controller 255 also generates a voltage that is coupled to the gates of bit line decoupling transistor 301 and the voltage clamp transistor 302. The bit line coupling transistor 301 is turned on and the PMOS resistive load transistor 300 begins to conduct current charging the selected bit line 306. It should be noted that the static current from the PMOS load transistor 300 is smaller than the current of an erased memory cell. The source node 305 of the voltage clamping transistor 302 is also charged to a voltage clamped at $V_{READ}$ 453. The voltage $V_{READ}$ 453 is a reference voltage connected to the positive input of the sense amplifier 128. If the selected memory cell is programmed, the bit line voltage 456 will charge to $V_{READ}$ 453 at which point the decoupling transistor 301 will turn off and the output of the bit line read path 304 will charge to $V_{DD}$ 452. The sense amplifier compares $V_{READ}$ 453 on the source node 305 of the voltage clamping transistor 302 to $V_{DD}$ on the output of the bit line read path 304 at a sensing time 458 and produces a logical "1" at the output of the sense amplifier 128. If the selected cell is erased, the memory cell current is larger than the PMOS load transistor 300, and the voltage of output of the selected bit line 304 falls to $V_{EC}$ 451, which is lower than $V_{READ}$ 453, that is coupled to the positive input of the sense amplifier 305. The sense amplifier compares a lower voltage $V_{EC}$ to $V_{READ}$ at the sensing time 458 and produces a logical "0" at the output of the sense amplifier. A verify operation is almost the same as the read operation with the difference being the bias voltage of the reference voltage generator 255 where a voltage of $V_{VERIFY}$ 454 is used in place of $V_{READ}$ 453. The voltages $V_{READ}$ 453 and $V_{VERIFY}$ 454 are generated from the output of the reference voltage controller 255 based on the band gap reference generator using the same method as that of the circuit in FIG. 8, so that the voltage difference 455 between the read voltage $V_{READ}$ 453 and $V_{VERIFY}$ 454 can be insured independently of temperature and supply voltage. Even though a variation of the precharging voltage of a bit line may vary because of process fluctuations that result in threshold voltage variations, the sensing and verify margins are assured because the same transistor 301 is used for sense and verify operations.

While the invention has been particularly shown and described with reference to preferred embodiments thereof, it will be understood by those skilled in the art that various changes in form and details may be made without departing from the spirit and scope of the invention.

What is claimed is:

1. A program verify circuit for nonvolatile memory cells, comprising:
   a) a nonvolatile memory chip,
   b) a bit line read path,
   c) a reference read path,
   d) a voltage control circuit connected in said bit line read path and said reference read path,
   e) a sense amplifier,
   f) an equalizer circuit to make voltages stored on the bit line read path and the reference read path a same amplitude, and
   g) an output node of the bit line read path and the output node of the reference read path connected to said sense amplifier inputs.

2. The circuit of claim 1, wherein the voltage control circuit further comprises:
   a) a band gap reference generator,
   b) a digital to analog converter,
   c) an NMOS switching device, and
   d) said band gap generator controls the digital to analog converter (DAC) to produce a set of voltages at an output of the DAC to control said voltage control circuit.

3. The circuit of claim 2, wherein the output of said DAC is coupled to all said control circuits in said memory chip to insure said set of voltages are applied to all said control circuits.

4. The circuit of claim 1, wherein the bit line read path further comprises:
   a) a selected nonvolatile memory cell from within a plurality of memory cells coupled to a bit line of the bit line read path,
   b) a column decoder circuit, and
   c) a load device.

5. The circuit of claim 4, wherein the load device couples a chip voltage to the bit line read path and charges the output node of the bit line read path when the control circuit isolates the selected bit line from the bit line read path.

6. The circuit of claim 1, wherein the reference read path further comprises:
   a) a dummy memory cell coupled to the reference read path, and
   b) a reference line decoder.

7. The circuit of claim 6, wherein said dummy memory cell provides a reference line load similar to that of a memory cell on a bit line read path.

8. The circuit of claim 1, wherein the voltage control circuit in the bit line read path charges the bit line to a precharge voltage and then decouples the bit line from the output node of the bit line read path.

9. The circuit of claim 1, wherein the control circuit in the reference read path charges the reference read path to a precharge voltage.

10. A method of verifying the programming of a nonvolatile memory cell, comprising:
   a) selecting a bit line read path coupled to a nonvolatile memory cell that is being verified for a program operation,
   b) connecting an output node of a bit line read path and an output node of a reference line read path to a sense amplifier,
   c) charging a bit line coupled to the bit line read path to precharge voltage,
   d) charging a reference line of the reference line read path to said precharge voltage,
   e) equalizing the bit line voltage and the reference line voltage, and then floating said reference line at the precharge voltage level,
   f) disconnecting said bit line from said output node of said bit line read path, charging said output of the bit line read path to a high chip voltage that is larger than the precharge voltage,
   g) selecting said memory cell allowing said bit line to be discharged, and if said bit line voltage drops to below a predetermined voltage level, then coupling said bit line voltage to said output node of the bit line read path and discharging the output node of the bit line read path to a voltage below said precharge voltage, and
   h) comparing output voltages of the bit line read path and the reference line read path using said sense amplifier to determine if the selected cell is programmed.

11. The method of claim 10, wherein said sense amplifier compares the output voltage of the bit line read path to the output voltage of the reference line read path after a predetermined period of time.

12. The method of claim 10, wherein charging said output of the bit line read path to a high chip voltage is done through a load device coupled to an external memory chip bias $V_{DD}$.

13. The method of claim 10, wherein equalizing the bit line voltage and the reference line voltage insures a same value exists on both the bit line and the reference line.

14. The verification of a program operation to a nonvolatile memory cell, comprising:
   a) a means for charging a selected bit line connected to a nonvolatile memory cell to a predetermined voltage and isolating said bit line from a bit line output node while maintaining the predetermined voltage charge,
   b) a means for charging a reference line to a predetermined voltage and isolating said reference line while maintaining the predetermined voltage charge,
   c) a means for equalizing the voltage charge between the selected bit line and the reference line,
   d) a means for charging said bit line output node to a voltage larger than said predetermined voltage while maintaining isolation from said selected bit line,
   e) a means for discharging said output node to a voltage below said predetermined voltage when said nonvolatile memory cell is in an erase state, and
   f) a means for comparing voltages on said output node and said reference line to determine if said memory cell has been programmed.

15. The verification of the program operation of claim 14, wherein the means for charging and isolating said selected bit line is performed by a bit line read path control circuit.

16. The verification of the program operation of claim 14, wherein the means for charging and isolating said reference line is performed by a reference line control circuit.

17. The verification of the program operation of claim 14, wherein the means for charging said bit line output node to said voltage larger than the predetermined voltage is through a load transistor connected to a high voltage chip bias.

18. The verification of the program operation of claim 14, wherein the means for discharging the output node uses the selected memory cell, which is in an erase state, to discharge the output node.

19. The verification of the program operation of claim 14, wherein the means for comparing voltages uses a sense amplifier coupled to the output node and the reference line.

20. A program verify circuit, comprising:
   a) a nonvolatile memory cell connected in a bit line read path containing a bit line column decoder circuit, a voltage control circuit, an output node and a load device connected to memory chip bias,
   b) said output node coupled to said input of the sense amplifier,
   c) said voltage control circuit coupled to a clamping transistor that in turn couples a verify reference voltage to an input of a sense amplifier,
   d) said voltage control isolates said bit line from said output node when said memory cell is programmed and allows the load device to charge the output node to a bias voltage,
   e) said sense amplifier compares said verify reference voltage to said bias voltage if said memory cell is programmed, and
   f) said sense amplifier compares said verify reference voltage to an erased cell voltage if said memory cell is erased.

21. The circuit of claim 20, wherein said voltage control circuit couples a read reference voltage to said clamping transistor and the input of the sense amplifier when performing a normal memory cell read operation whereby an output node voltage is compared to the read reference voltage.

22. The circuit of claim 20, wherein the comparison performed by the sense amplifier occurs after a predetermined amount of time.

23. The circuit of claim 20, wherein the bias voltage is larger than the verify reference voltage.

24. The circuit of claim 20, wherein the erased cell voltage is smaller than the verify reference voltage.

25. A method of verifying a program of a nonvolatile memory cell, comprising:
   a) discharging a bit line coupled to a selected nonvolatile memory cell to ground,
   b) charging said bit line,
   c) isolating said bit line from an output node of a bit line read path when said memory cell is programmed thereby allowing said output node to charge further to an external chip bias,
   d) coupling a verify reference voltage and an output voltage of said output node to sense amplifier inputs, and
   d) comparing said verify reference voltage and said output voltage to determine if said memory cell is programmed.

26. The method of claim 25, wherein said output voltage is an erase voltage of the memory cell and is smaller than said verify reference voltage when the memory cell is not programmed.

27. The method of claim 25, wherein said output voltage is said external chip bias and is larger than said verify reference voltage when the memory cell is programmed.

28. The method of claim 25, wherein said verify reference voltage is replace with a read reference voltage during a read operation of said memory cell.

29. A program verify operation for a nonvolatile memory cell, comprising:
   a) a means for charging a bit line coupled to a nonvolatile memory cell,
   b) a means for creating a verify reference voltage and coupling said verify reference voltage to a sense amplifier input,
   c) a means for isolating said bit line from an output node of a bit line read path thereby allowing said output node to further charge to a chip bias voltage when memory cell is programmed, and
   d) a means for comparing said verify reference voltage to a voltage on said output node after a predetermined amount of time.

30. The program verify operation of claim 29, wherein said means for comparing said verify reference voltage to said output node voltage compares the verify reference voltage to an erase voltage when said memory cell is erased.

31. The program verify operation of claim 30, wherein said means for comparing said verify reference voltage to said output node voltage compares the verify reference voltage to an erase voltage where said erase voltage is smaller than said verify reference voltage.

32. The program verify operation of claim 29, wherein said means for comparing said verify reference voltage to said output node voltage compares the verify reference voltage to said chip bias where said chip bias voltage is larger than said verify reference voltage.

* * * * *